(12) United States Patent
Scott et al.

(10) Patent No.: US 8,253,782 B2
(45) Date of Patent: Aug. 28, 2012

(54) INTEGRATED STORAGE FOR INDUSTRIAL INSPECTION HANDSET

(75) Inventors: Joshua Lynn Scott, Jordan, NY (US); James J. Delmonico, Baldwinsville, NY (US); Joseph V. Lopez, Camillus, NY (US); Todd B. Abernethy, Skaneateles, NY (US)

(73) Assignee: GE Inspection Technologies, LP, Lewistown, PA (US)

( * ) Notice: Subject to any disclaimer, the term of this patent is extended or adjusted under 35 U.S.C. 154(b) by 1341 days.

(21) Appl. No.: 11/925,043

(22) Filed: Oct. 26, 2007

(65) Prior Publication Data
US 2009/0109283 A1    Apr. 30, 2009

(51) Int. Cl.
*A62B 1/04* (2006.01)
(52) U.S. Cl. .......................................................... 348/65
(58) Field of Classification Search .................. 348/45, 348/65, 72; 600/101, 104, 132, 145, 164
See application file for complete search history.

(56) References Cited

U.S. PATENT DOCUMENTS

| | | |
|---|---|---|
| 4,700,693 A | 10/1987 | Lia et al. |
| 4,727,859 A | 3/1988 | Lia |
| 4,733,937 A | 3/1988 | Lia et al. |
| 4,735,501 A | 4/1988 | Ginsburgh et al. |
| 4,787,369 A | 11/1988 | Allred, III et al. |
| 4,790,294 A | 12/1988 | Allred, III et al. |
| 4,794,912 A | 1/1989 | Lia |
| 4,796,607 A | 1/1989 | Allred, III et al. |
| 4,853,774 A | 8/1989 | Danna et al. |
| 4,862,253 A | 8/1989 | English et al. |
| 4,887,154 A | 12/1989 | Wawro et al. |
| 4,909,600 A | 3/1990 | Ciarlei et al. |
| 4,913,369 A | 4/1990 | Lia et al. |
| 4,941,454 A | 7/1990 | Wood et al. |
| 4,941,456 A | 7/1990 | Wood et al. |
| 4,980,763 A | 12/1990 | Lia |
| 4,989,581 A | 2/1991 | Tamburrino et al. |
| 4,998,182 A | 3/1991 | Krauter et al. |
| 5,018,436 A | 5/1991 | Evangelista et al. |
| 5,018,506 A | 5/1991 | Danna et al. |
| 5,019,121 A | 5/1991 | Krauter |
| 5,047,848 A | 9/1991 | Krauter |
| 5,052,803 A | 10/1991 | Krauter |
| 5,061,995 A | 10/1991 | Lia et al. |

(Continued)

*Primary Examiner* — Moustafa M Meky
*Assistant Examiner* — Sargon Nano
(74) *Attorney, Agent, or Firm* — Global Patent Operation; Mark A. Conklin

(57) ABSTRACT

An industrial inspection handset is disclosed, comprising a connector for connecting a peripheral device to the handset, wherein the connector is oriented such that the peripheral device can extend substantially parallel to the housing surface of the handset, and a cover tethered to the handset by a first tab, wherein the cover when mounted on the housing of the handset encloses the connector and the peripheral device. In an alternative embodiment, the handset comprises a connector oriented such that the peripheral device can extend substantially perpendicular to the housing surface of the handset, and a cover tethered to the handset by a first tab and a second tab, wherein the cover when mounted on the mounting member encloses the connector. A method of replacing a cover tethered to an industrial inspection handset is also disclosed, wherein the first cover is tethered to the handset by a first tab, comprising the steps of removing the first cover from the first tab; forcing the first tab through an opening in the handset and into the interior of the handset; and tethering a second cover to the handset by inserting a second tab attached to the second cover through the opening in the handset.

18 Claims, 6 Drawing Sheets

U.S. PATENT DOCUMENTS

| | | | |
|---|---|---|---|
| 5,066,122 A | 11/1991 | Krauter | |
| 5,070,401 A | 12/1991 | Salvati et al. | |
| 5,114,636 A | 5/1992 | Evangelista et al. | |
| 5,140,975 A | 8/1992 | Krauter | |
| 5,191,879 A | 3/1993 | Krauter | |
| 5,202,758 A | 4/1993 | Tamburrino | |
| 5,203,319 A | 4/1993 | Danna et al. | |
| 5,275,152 A | 1/1994 | Krauter et al. | |
| 5,278,642 A | 1/1994 | Danna et al. | |
| 5,314,070 A | 5/1994 | Ciarlei | |
| 5,323,899 A | 6/1994 | Strom et al. | |
| 5,345,339 A | 9/1994 | Knieriem et al. | |
| 5,347,989 A | 9/1994 | Monroe et al. | |
| 5,365,331 A | 11/1994 | Tamburrino et al. | |
| 5,373,317 A | 12/1994 | Salvati et al. | |
| D358,471 S | 5/1995 | Cope et al. | |
| 5,435,296 A | 7/1995 | Vivenzio et al. | |
| 5,632,717 A * | 5/1997 | Yoon | 600/106 |
| 5,633,675 A | 5/1997 | Danna et al. | |
| 5,701,155 A | 12/1997 | Wood et al. | |
| 5,734,418 A | 3/1998 | Danna | |
| 5,754,313 A | 5/1998 | Pelchy et al. | |
| 5,857,963 A | 1/1999 | Pelchy et al. | |
| 6,083,152 A | 7/2000 | Strong | |
| 6,097,848 A | 8/2000 | Salvati | |
| 6,310,642 B1 * | 10/2001 | Adair et al. | 348/76 |
| 6,468,201 B1 | 10/2002 | Burdick | |
| 6,483,535 B1 | 11/2002 | Tamburrino et al. | |
| 6,494,739 B1 | 12/2002 | Vivenzio et al. | |
| 6,538,732 B1 | 3/2003 | Drost et al. | |
| 6,554,765 B1 | 4/2003 | Yarush et al. | |
| 6,590,470 B1 | 7/2003 | Burdick | |
| 6,830,545 B2 | 12/2004 | Bendall | |
| 6,847,394 B1 | 1/2005 | Hansen et al. | |
| 6,953,432 B2 | 10/2005 | Schiefer | |
| 6,982,740 B2 * | 1/2006 | Adair et al. | 348/76 |
| 7,030,904 B2 * | 4/2006 | Adair et al. | 348/76 |
| 7,048,686 B2 | 5/2006 | Kameya et al. | |
| 7,134,993 B2 | 11/2006 | Lia et al. | |
| 7,170,677 B1 | 1/2007 | Bendall et al. | |
| 7,262,797 B2 | 8/2007 | Weldum et al. | |
| 7,289,139 B2 * | 10/2007 | Amling et al. | 348/65 |
| 8,157,726 B2 * | 4/2012 | Melder | 600/112 |
| 2003/0212308 A1 | 11/2003 | Bendall | |
| 2004/0183900 A1 | 9/2004 | Karpen et al. | |
| 2004/0215413 A1 | 10/2004 | Weldum et al. | |
| 2004/0233318 A1 | 11/2004 | Schiefer | |
| 2005/0050707 A1 | 3/2005 | Scott et al. | |
| 2005/0129108 A1 | 6/2005 | Bendall et al. | |
| 2005/0162643 A1 | 7/2005 | Karpen | |
| 2005/0165275 A1 | 7/2005 | Von Felten et al. | |
| 2005/0168571 A1 | 8/2005 | Lia et al. | |
| 2005/0281520 A1 | 12/2005 | Kehoskie et al. | |
| 2006/0050983 A1 | 3/2006 | Bendall et al. | |
| 2006/0072903 A1 | 4/2006 | Weldum et al. | |
| 2006/0114986 A1 * | 6/2006 | Knapp et al. | 375/240.01 |
| 2006/0155168 A1 | 7/2006 | Pease | |
| 2006/0164511 A1 * | 7/2006 | Krupnik | 348/65 |
| 2006/0167340 A1 | 7/2006 | Pease et al. | |
| 2007/0030344 A1 | 2/2007 | Miyamoto et al. | |
| 2007/0070340 A1 * | 3/2007 | Karpen | 356/241.1 |
| 2007/0091183 A1 | 4/2007 | Bendall et al. | |
| 2007/0129604 A1 | 6/2007 | Hatcher et al. | |
| 2007/0156018 A1 * | 7/2007 | Krauter et al. | 600/102 |
| 2007/0156021 A1 | 7/2007 | Morse et al. | |
| 2007/0165306 A1 | 7/2007 | Bendall et al. | |
| 2007/0187574 A1 | 8/2007 | Lia | |
| 2007/0188604 A1 | 8/2007 | Miyamoto et al. | |
| 2007/0225561 A1 | 9/2007 | Watanabe et al. | |
| 2007/0225931 A1 | 9/2007 | Morse et al. | |
| 2007/0226258 A1 | 9/2007 | Lambdin et al. | |
| 2007/0249904 A1 | 10/2007 | Amano et al. | |
| 2007/0255100 A1 | 11/2007 | Barlow et al. | |
| 2008/0009677 A1 | 1/2008 | Shoroji et al. | |
| 2008/0021268 A1 | 1/2008 | Shoroji et al. | |
| 2008/0052348 A1 * | 2/2008 | Adler et al. | 709/203 |
| 2008/0068519 A1 * | 3/2008 | Adler et al. | 348/838 |
| 2008/0151047 A1 * | 6/2008 | Bendall | 348/135 |
| 2008/0152210 A1 * | 6/2008 | Bendall | 382/141 |
| 2008/0157994 A1 * | 7/2008 | Morse et al. | 340/825 |

* cited by examiner

INTEGRATED STORAGE FOR INDUSTRIAL INSPECTION HANDSET

BACKGROUND OF THE INVENTION

This invention relates generally to an industrial inspection apparatus and more particularly to integrated storage for an industrial inspection handset.

Industrial inspection apparatuses, such as endoscopes or borescopes, can include a handset tethered to a base unit by a cable or other connecting means. In this configuration, while it is the handset that actually conducts the inspection activities, it is the base unit that contains a significant amount of the hardware and processing capacity required by the industrial inspection apparatus. For example, the base unit could include various interfaces for plugging in or connecting peripheral devices such as portable memory devices (e.g., USB memory (or "thumb") drive, memory cards), audio devices (e.g., headsets), wireless devices, or displays (e.g., computer monitors (VGA)) for storage and/or display of the data acquired during an inspection. An advantage of having these interfaces or peripheral connector bays within the base unit is the ability to protect these interfaces and connected devices from the harsh environments and conditions typically encountered during an inspection, including adverse weather conditions. A disadvantage of having the base unit to supporting the operations of the handset is the limitation on the flexibility and portability of the person conducting the inspection with the handset, which must always remain tethered to the base unit, which, in turn, is often required to be connected to a source of electrical power.

A potential solution to the disadvantages of requiring a base unit is to relocate some or all of the hardware and processing capacity required by the industrial inspection apparatus from the base unit to the handset, thereby eliminating the need for a tethered connection between the two devices. For example, rather than having the peripheral devices connected to the base unit, these devices can be connected to peripheral connector bays on the handset during and/or after the inspection. Since the handset is directly exposed to the harsh environments and conditions typically encountered during an inspection, these peripheral devices and the peripheral connector bays need to be protected. In addition, these peripheral devices and the peripheral connector bays also need to be protected from damage by an user inadvertently dropping the handset. It would be advantageous to provide one or more storage compartments integrated within the handset that would provide the protection required by these peripheral devices and peripheral connector bays during and/or after an inspection without significantly increasing the package size of the handset.

BRIEF DESCRIPTION OF THE INVENTION

In one embodiment of the present invention, an industrial inspection handset is disclosed, comprising a connector for connecting a peripheral device to the handset, wherein the connector is oriented such that the peripheral device can extend substantially parallel to the housing surface of the handset, and a cover tethered to the handset by a first tab, wherein the cover when mounted on the housing of the handset encloses the connector and the peripheral device. In an alternative embodiment, the handset comprises a connector oriented such that the peripheral device can extend substantially perpendicular to the housing surface of the handset, and a cover tethered to the handset by a first tab and a second tab, wherein the cover when mounted on the mounting member encloses the connector. A method of replacing a cover tethered to an industrial inspection handset is also disclosed, wherein the first cover is tethered to the handset by a first tab, comprising the steps of removing the first cover from the first tab; forcing the first tab through an opening in the handset and into the interior of the handset; and tethering a second cover to the handset by inserting a second tab attached to the second cover through the opening in the handset.

DETAILED DESCRIPTION OF THE INVENTION

Figure 1:
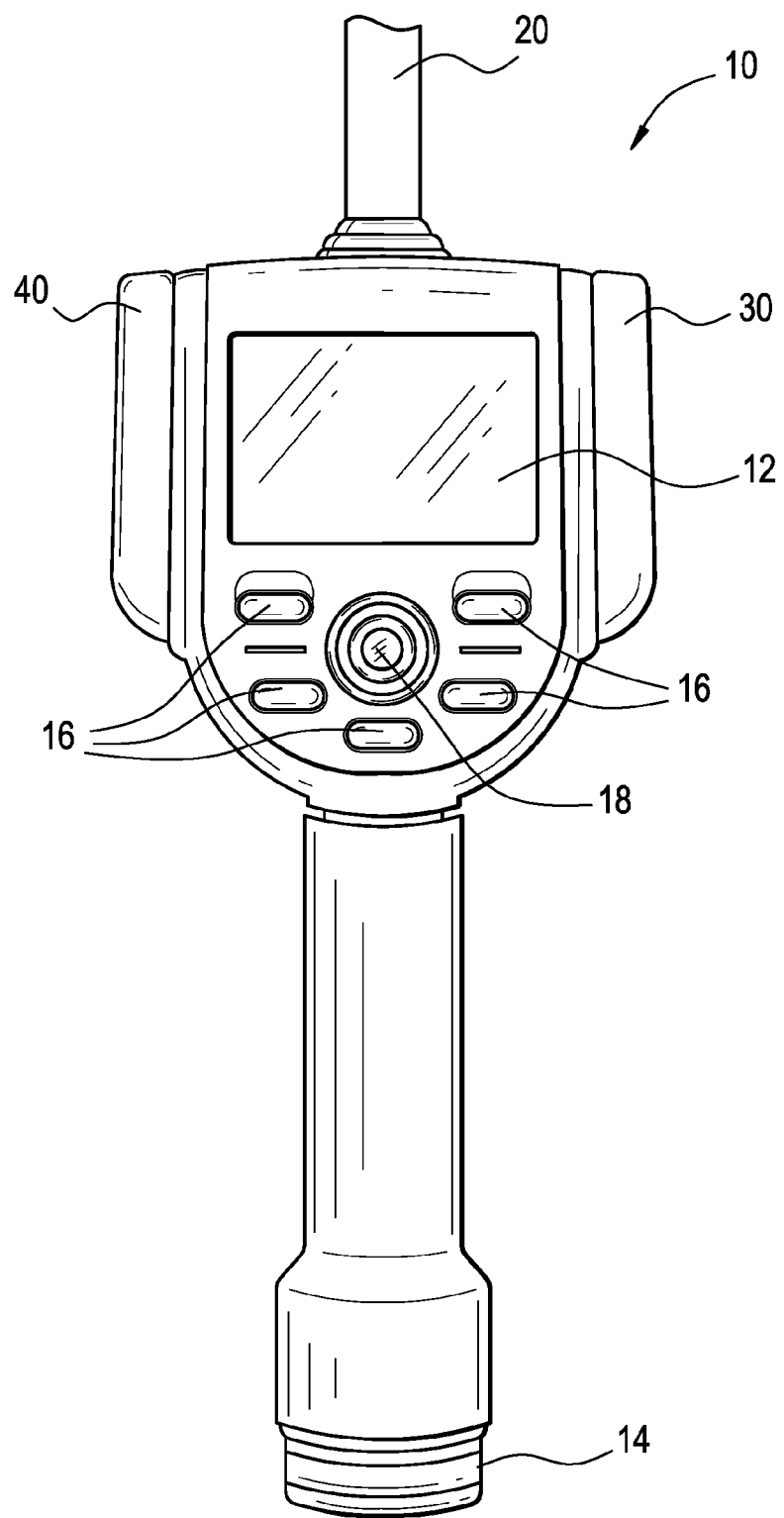
FIG. 1 is a front view of an industrial inspection handset.

FIG. 1 illustrates an industrial inspection handset 10 made in accordance with the preferred embodiment of the invention. While FIG. 1 depicts the preferred embodiment of the present invention as an industrial video endoscope, the present invention is also applicable to other types of industrial inspectional apparatuses (e.g., other nondestructive testing devices using eddy current and ultrasonic techniques). Additionally, while FIG. 1 depicts a tetherless inspection handset, the present invention is also applicable to conventional handsets requiring a connection to a base unit. The handset 10 of FIG. 1 includes a display 12 for providing visual information to the user; a battery assembly 14 for providing power to the handset 10 for tetherless operation not requiring connection to a base unit, control buttons 16 and a control joystick 18 for operating the handset 10, and an insertion tube 20 for conducting a visual inspection of an object. The housing of the handset 10 protects the internal components of the handset 10. The handset 10 also includes a right cover 30 for protecting the peripheral connector bay 50 (not shown) on the right side of the handset 10, and a left cover 40 for protecting the peripheral connector bay 60 (not shown) on the left side of the handset 10.

Figure 2:
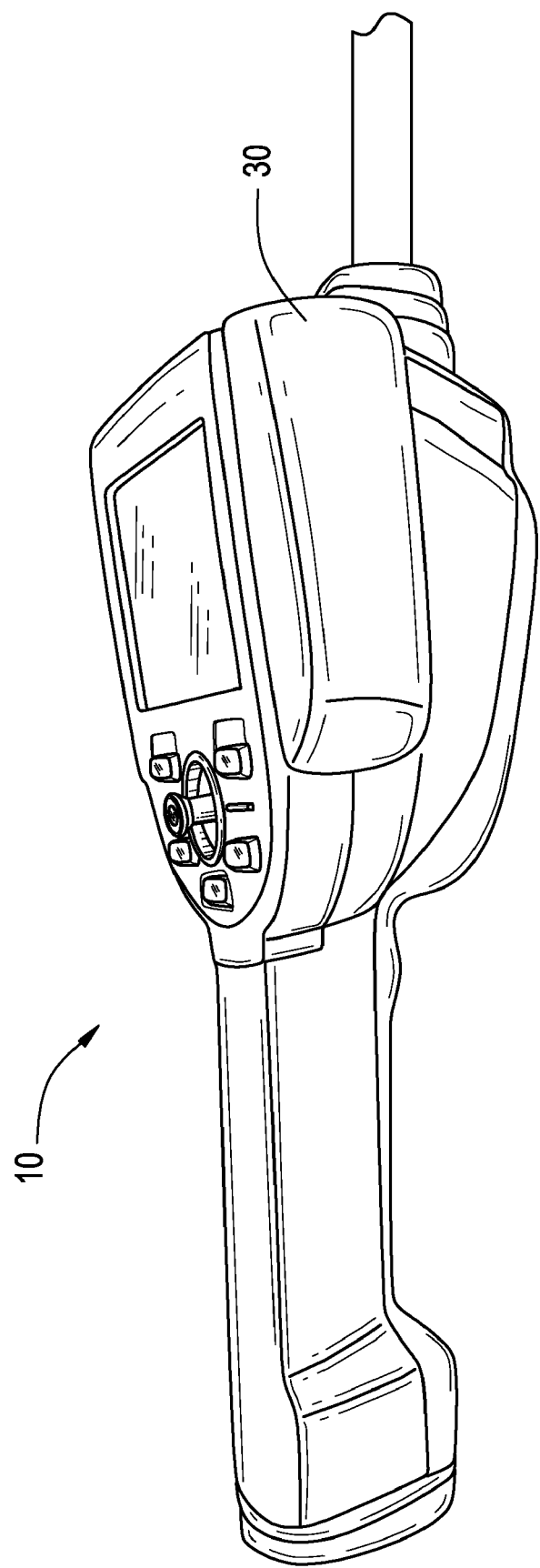
FIG. 2 is a side view of the right side of the industrial inspection handset.
Figure 3:
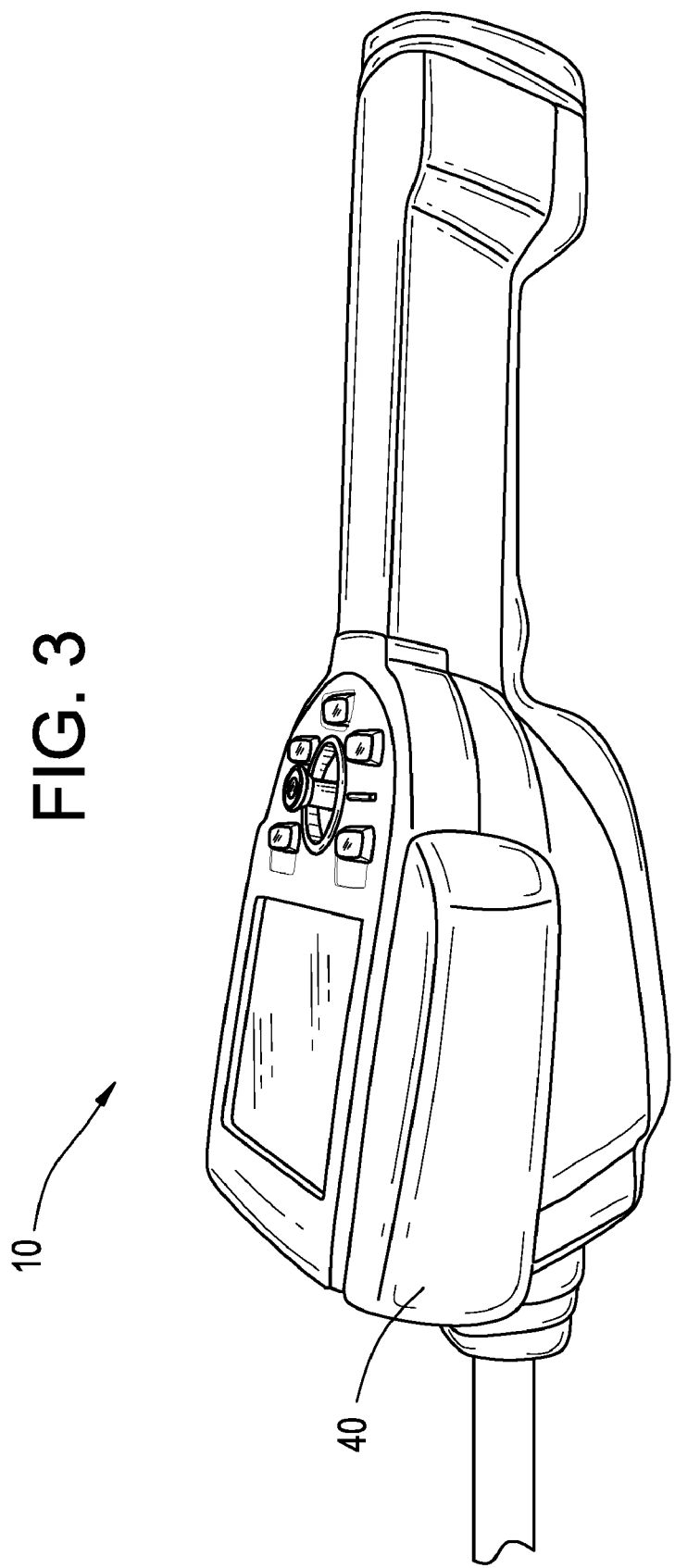
FIG. 3 is a side view of the left side of the industrial inspection handset.

FIG. 2 illustrates a side view of the right side of the industrial inspection handset 10 shown in FIG. 1, while FIG. 3 illustrates a side view of the left side of the handset 10. As shown, both the right cover 30 and left cover 40 are secured to the handset 10 providing protection to the right peripheral connector bay 50 (not shown) and left peripheral connector bay 60 (not shown), respectively.

Figure 4:
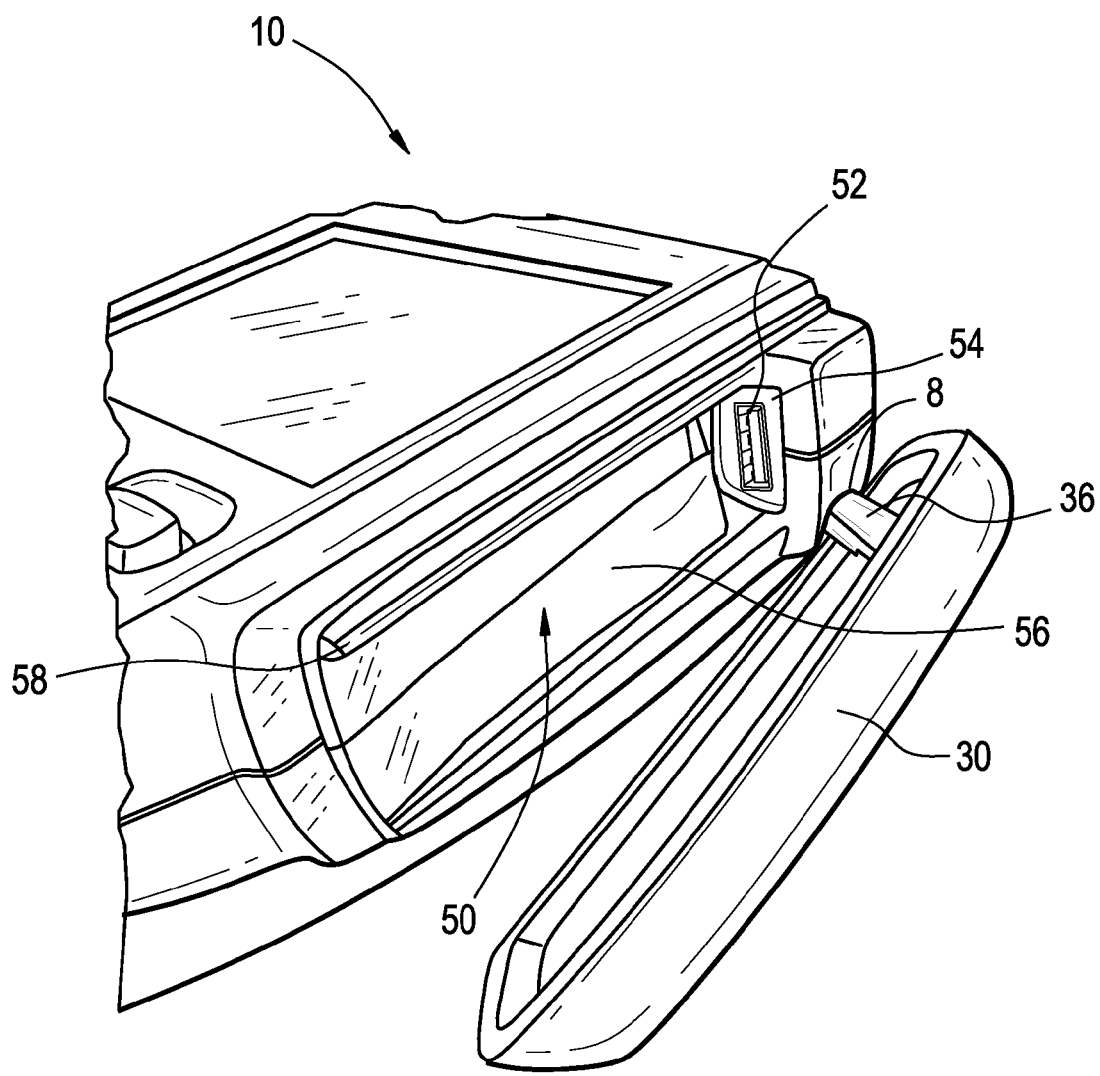
FIG. 4 is a perspective view of the right side of the industrial inspection handset with the cover of the peripheral connector bay removed.
Figure 5:
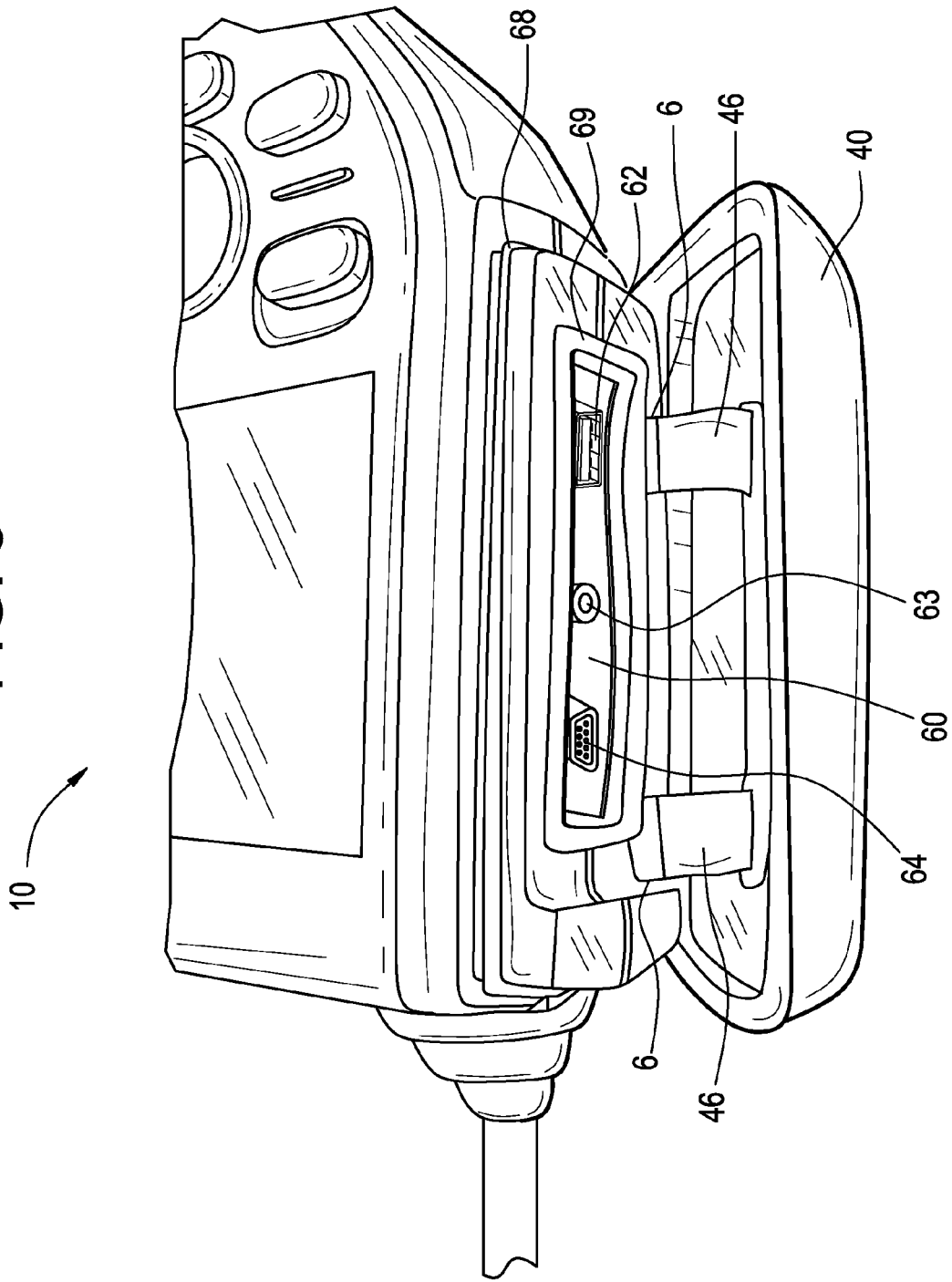
FIG. 5 is a perspective view of the left side of the industrial inspection handset with the cover of the peripheral connector bay removed.

FIG. 4 illustrates a perspective view of the right side of the industrial inspection handset 10 with the right cover 30 for the right peripheral connector bay 50 removed, while FIG. 5 illustrates a perspective view of the left side of the handset 10 with the left cover 40 for the left peripheral connector bay 60 removed.

In the preferred embodiment, the right peripheral connector bay 50 includes connector 52 for a USB memory drive (not shown). The USB memory drive connector 52 is surrounded by an elastomeric grommet 54, which provides both a seal around the USB memory drive connector 52 and additional flexibility for connecting and disconnecting a peripheral device. Further flexibility is provided by indirectly tethering the USB memory drive connector 52 with wires to a circuit board within the handset 10, rather than direct connections onto the circuit boards. In an alternative embodiment, a USB memory drive connector 52 can be provided that pivots to facilitate connection and disconnection of a peripheral device.

As shown in FIG. 4, the USB memory drive connector 52 of the preferred embodiment is oriented so that the peripheral device, when connected, lies substantially parallel to the adjacent surface 56 of the housing of the handset 10. This orientation allows the right cover 30 to be installed over the connected peripheral device, providing protection from the environment to the device and the USB memory drive connector 52 or from an accidental drop.

As also shown in FIG. 4, the right cover 30 is tethered to the handset 10 by a tab 36, which is inserted through and held in place by an opening 8 in the handset 10. Use of a single tab 36, allows the right cover 30 to hang out of the way, providing greater access to the right peripheral connector bay 50. The tab 36 tethers the right cover 30 to the handset 10 to prevent loss of the cover 30 during or after an inspection. In an alternative embodiment, the right cover 30 can be constructed with a plurality of tabs 36, providing less access to the right peripheral connector bay 50 than with the single tab 36. In the preferred embodiment, the tab or tabs 36 are made from a non-conductive material (e.g., versollan) so that if the cover 30 is damaged or torn from the tab 36, the tabs 36 can simply be pushed through the openings 8 and not adversely affect the performance of the circuit boards or other electronics within the handset 10. This allows the right cover 30 to be field replaceable. In an alternative embodiment, the tab or tabs 36 are made from a conductive material. So as not to adversely affect the performance of the circuit boards or other electronics within the handset 10 when the tabs 36 are pushed through the openings 8, they are received by a compartment within the handset 10 that is electrically isolated from the circuit boards or other electronics.

While the preferred embodiment describes protecting a USB memory drive connector 52 and USB memory drive with the right cover 30, the present invention is not limited to such devices. For example, in an alternative embodiment, the USB memory drive connector 52 can be replaced by a connector for a wireless transmitter in order to provide wireless communications to and from the handset 10.

In the preferred embodiment, the left peripheral connector bay 60 includes a VGA connector 64 for interfacing with a display device, such as a computer monitor. The left peripheral connector bay 60 also includes a connector jack 63 for a phone or audio headset, as well as an additional USB memory drive connector 62. All of these connectors are surrounded by a sealing grommet 69. While the preferred embodiment describes protecting a VGA connector 64, audio jack 63, and USB memory drive connector 62 with the left cover 40, the present invention is not limited to such connectors.

As shown in FIG. 5, unlike the right peripheral connector bay 50, the connectors of the left peripheral connector bay 60 are oriented so that the peripheral devices, when connected, lie substantially perpendicular to the adjacent surface 66 of the handset 10. This orientation would not allow the left cover 40 to be installed over the connected peripheral devices (or associated cables), and therefore would not be suitable for use during an inspection in some harsh environments. Rather, this left peripheral connector bay 60 would be used largely after an inspection to access and analyze the data collected during the inspection.

As also shown in FIG. 5, the left cover 40 is tethered to the handset 10 with two tabs 46, which are inserted through and held in place by openings 6 in the handset 10. Use of two tabs 46 allows the left cover 40 to be hinged at the bottom and hang open substantially perpendicular to the left peripheral connector bay 60 and provide support and drop-protection for any peripheral devices or cables connected. The two tabs 46 tether the left cover 40 to the handset 10 to prevent loss of the cover 40 during or after an inspection. The two tabs 46 are made from a non-conductive material (e.g., versollan) so that if the cover 40 is damaged or torn from the tabs 46, the tabs 46 can simply be pushed through the openings 6 and not adversely affect the performance of the circuit boards or other electronics within the handset 10. This allows the left cover 40 to be field replaceable.

Figure 6:
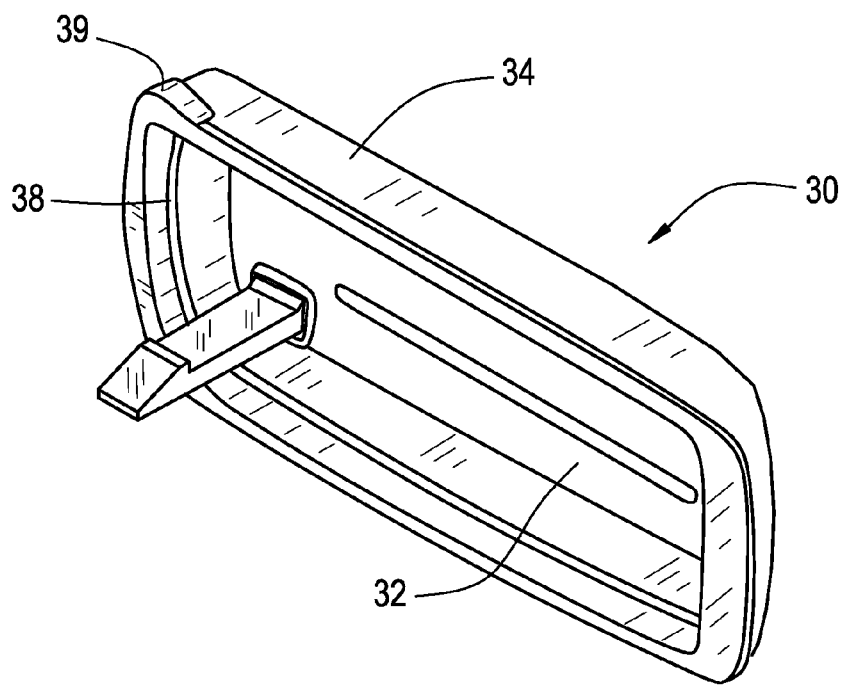
FIG. 6 is a perspective view of the cover of the peripheral connector bay on the right side of the industrial inspection handset.
Figure 7:
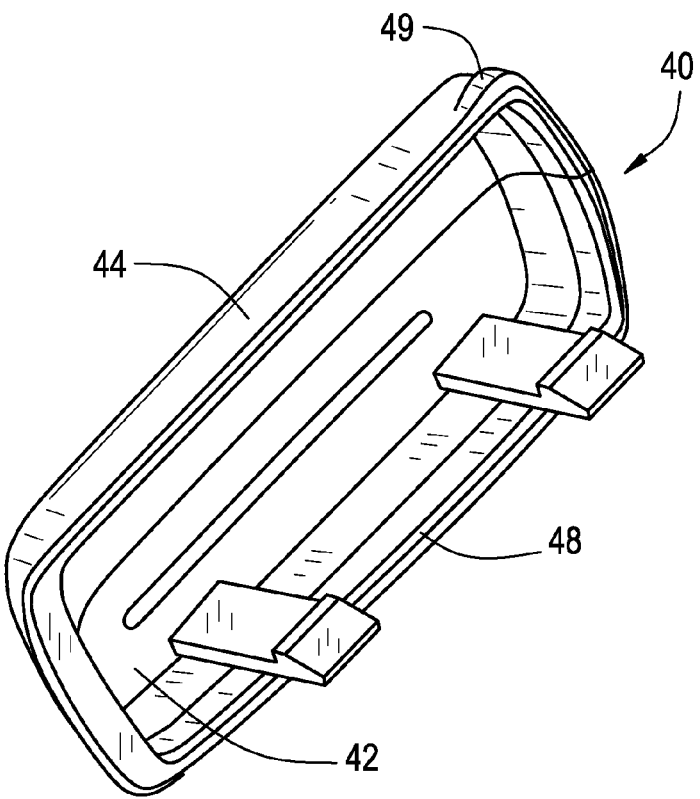
FIG. 7 is a perspective view of the cover of the peripheral connector bay on the left side of the industrial inspection handset.

FIG. 6 illustrates a perspective view of the right cover 30, while FIG. 7 illustrates a perspective view of the left cover 40. In the preferred embodiment, both the right cover 30 and left cover 40 are constructed of two materials. The inner base 32, 42 of each cover is made of a strong rigid material (e.g., polycarbonate material) to provide rigidity, while the outer shell 34, 44 is made of a softer material (e.g., versollan) to provide a flexible compliant material that will form a seal with the handset 10. The outer shell 34, 44 of the covers 30, 40 can provide visual indication of what types of connectors or devices are available inside of the covers 30, 40. The outer shell 34, 44 of each cover 30, 40 includes a seal gland 38, 48 extending around the edge of the cover 30, 40, which mates and forms a seal with a lip 58, 68 on the housing of the handset 10 that at least partially circumscribes the connector bays 50, 60. The outer shell 34, 44 also includes a small pull tab 39, 49 at the top of the covers 30, 40 to facilitate breaking the seal and pulling the cover 30, 40 off of the handset 10.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An industrial inspection handset, comprising:
a display for providing visual information to a user;
a housing supporting the display and enclosing internal components of said handset;
a peripheral connector bay formed as part of a side of said housing, the peripheral connector bay at least partially circumscribing a first housing surface;
a connector disposed in the peripheral connector bay adjacent said first housing surface, wherein said connector is oriented to receive a peripheral device so that the peripheral device can extend parallel to said first housing surface; and
a cover tethered to said housing by a first tab attached to said cover and inserted through and held in place by a first opening in said housing, said cover having a sealing member for mating with a lip on said housing that at least partially circumscribes the peripheral connector bay, wherein said cover, when mounted on said housing, encloses said connector and said peripheral device.

2. The industrial inspection handset of claim 1, wherein said connector is a USB memory drive connector and said peripheral device is a USB memory drive.

3. The industrial inspection handset of claim 1, wherein said connector is a wireless transmitter connector and said peripheral device is a wireless transmitter.

4. The industrial inspection handset of claim 1, wherein said connector pivots to facilitate connection and disconnection of said peripheral device.

5. The industrial inspection handset of claim 1, wherein said connector is tethered to a circuit board within said handset.

6. The industrial inspection handset of claim 1, wherein said connector is surrounded by an elastomeric grommet.

7. The industrial inspection handset of claim 1, wherein said handset is a video endoscope.

8. The industrial inspection handset of claim 1, further comprising a battery assembly for providing power when said handset is not connected to a base unit.

9. The industrial inspection handset of claim 1, wherein said cover further comprises a second tab inserted through and held in place by a second opening in said housing.

10. The industrial inspection handset of claim 1, wherein said first tab is made from a non-conductive material.

11. The industrial inspection handset of claim 1, wherein said cover comprises an inner base made of a first material and an outer shell made of a second material.

12. An industrial inspection handset, comprising:
a display for providing visual information to a user;
a housing supporting the display and enclosing internal components of said handset;
a peripheral connector bay formed as part of a side of said housing, the peripheral connector bay at least partially circumscribing a first housing surface;
a connector disposed in the peripheral connector bay adjacent said first housing surface, wherein said connector is oriented to receive a peripheral device so that the peripheral device can extend perpendicular to said first housing surface; and
a cover tethered to said housing by a first tab attached to said cover and inserted through and held in place by a first opening in said housing and a second tab attached to said cover and inserted through and held in place by a second opening in said housing, said cover having a sealing member for mating with a lip on housing that at least partially circumscribes the peripheral connector bay,
wherein said cover, when mounted on said housing, encloses said connector, and
wherein said cover, when opened, hangs perpendicular to said first housing surface.

13. The industrial inspection handset of claim 12, wherein said connector is a USB memory drive connector and said peripheral device is a USB memory drive.

14. The industrial inspection handset of claim 13, wherein said cover when opened provides support for said peripheral device.

15. The industrial inspection handset of claim 12, wherein said connector is a VGA connector and said peripheral device is a VGA monitor.

16. The industrial inspection handset of claim 12, wherein said handset is a video endoscope.

17. The industrial inspection handset of claim 12, further comprising a battery assembly for providing power when said handset is not connected to a base unit.

18. The industrial inspection handset of claim 1, wherein said first tab and said second tab are made from a non-conductive material.

\* \* \* \* \*

UNITED STATES PATENT AND TRADEMARK OFFICE
CERTIFICATE OF CORRECTION

| | |
|---|---|
| PATENT NO. | : 8,253,782 B2 |
| APPLICATION NO. | : 11/925043 |
| DATED | : August 28, 2012 |
| INVENTOR(S) | : Joshua Lynn Scott |

It is certified that error appears in the above-identified patent and that said Letters Patent is hereby corrected as shown below:

Column 1 prior to the heading BACKGROUND OF THE INVENTION please insert the following:

--STATEMENT OF FEDERALLY SPONSORED RESEARCH OR DEVELOPMENT

This invention was made with Government support under Contract No. N68335-06-C-0341 awarded by the Department of the Navy. The Government has certain rights in this invention.--

Signed and Sealed this
Nineteenth Day of February, 2013

Teresa Stanek Rea
*Acting Director of the United States Patent and Trademark Office*